(12) United States Patent
Aulnette et al.

(10) Patent No.: US 7,572,714 B2
(45) Date of Patent: Aug. 11, 2009

(54) FILM TAKING-OFF METHOD

(75) Inventors: Cécile Aulnette, Grenoble (FR); Ian Cayrefourcq, St. Nazire les Eymes (FR); Carlos Mazure, Bernin (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 332 days.

(21) Appl. No.: 11/221,045

(22) Filed: Sep. 6, 2005

(65) Prior Publication Data

US 2007/0023867 A1 Feb. 1, 2007

(30) Foreign Application Priority Data

Jul. 8, 2005 (FR) ................................. 05 07300

(51) Int. Cl.
*H01L 21/30* (2006.01)
(52) U.S. Cl. ................ 438/458; 438/514; 257/E21.568
(58) Field of Classification Search ................ 438/456, 438/458, 429, 514; 257/632, E21.568, 618
See application file for complete search history.

(56) References Cited

U.S. PATENT DOCUMENTS

| | | | | |
|---|---|---|---|---|
| 6,225,193 | B1 * | 5/2001 | Simpson et al. | 438/460 |
| 6,596,610 | B1 | 7/2003 | Kuwabara et al. | 438/458 |
| 6,831,350 | B1 * | 12/2004 | Liu et al. | 257/617 |
| 6,979,649 | B2 * | 12/2005 | Arai et al. | 438/691 |
| 7,018,910 | B2 | 3/2006 | Ghyselen et al. | 438/458 |
| 7,122,095 | B2 * | 10/2006 | Letertre et al. | 156/344 |
| 7,224,031 | B2 * | 5/2007 | Uchida | 257/347 |
| 2002/0160610 | A1 | 10/2002 | Arai et al. | 438/692 |
| 2003/0008478 | A1 | 1/2003 | Abe et al. | 438/459 |
| 2004/0012075 | A1* | 1/2004 | Bedell et al. | 257/616 |
| 2004/0121557 | A1* | 6/2004 | Ghyselen | 438/455 |
| 2004/0137698 | A1* | 7/2004 | Taraschi et al. | 438/458 |
| 2005/0153487 | A1* | 7/2005 | Bedell et al. | 438/149 |
| 2005/0218453 | A1* | 10/2005 | Langdo et al. | 257/352 |

(Continued)

FOREIGN PATENT DOCUMENTS

EP 0159 409 A2 12/1984

(Continued)

OTHER PUBLICATIONS

TIPO's Search Report Appln. No. 095124731dated Aug. 4, 2008.

*Primary Examiner*—W. David Coleman
*Assistant Examiner*—Latanya Crawford
(74) *Attorney, Agent, or Firm*—Winston & Strawn LLP (57) ABSTRACT

The invention relates to a method of producing a film intended for applications in electronics, optics or optronics starting from an initial wafer, which includes a step of implanting atomic species through one of the faces of the wafer. This method includes forming a step of defined height around the periphery of the wafer, with the step having a mean thickness that is less than that of the wafer; and selectively implanting atomic species through a face of the wafer but not through the step to form an implanted zone at a defined implant depth with the film being defined between the face of the wafer and the implanted zone. The implantation of atomic species into the step can be prevented by forming a protective layer at least over the step or by masking the step. The invention also relates to a wafer obtainable by the method.

24 Claims, 5 Drawing Sheets

U.S. PATENT DOCUMENTS

2007/0018266 A1 * 1/2007 Dupont et al. .............. 257/440

FOREIGN PATENT DOCUMENTS

| FR | 2 842 349 | 1/2004 |
| FR | 2 852 445 | 9/2004 |
| TW | 0527662 B | 4/2003 |
| TW | 0569296 B | 1/2004 |
| WO | WO 2004/081974 A2 | 9/2004 |
| WO | WO 2005/038903 A1 | 4/2005 |
| WO | WO 2005/053018 A1 | 6/2005 |

* cited by examiner

FIG. 1A

PRIOR ART

FIG. 1B

PRIOR ART

FIG. 1C

PRIOR ART

FIG. 2A

PRIOR ART

FIG. 2B

PRIOR ART

FIG. 2C

PRIOR ART

FILM TAKING-OFF METHOD

BACKGROUND OF THE INVENTION

The present invention relates to the production of a film, starting from an initial wafer, including a step of implanting atomic species through one of its faces in order to form therein a buried implanted zone at a defined depth, with the film to be produced then being bounded by the implanted face of the wafer and by this implanted zone.

Figure 1A:
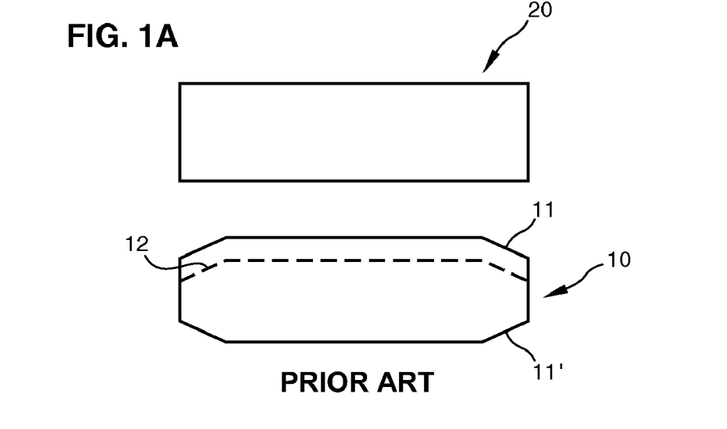
FIGS. 1A to 1C show various stages of a first known method for lifting off a film.
Figure 1B:
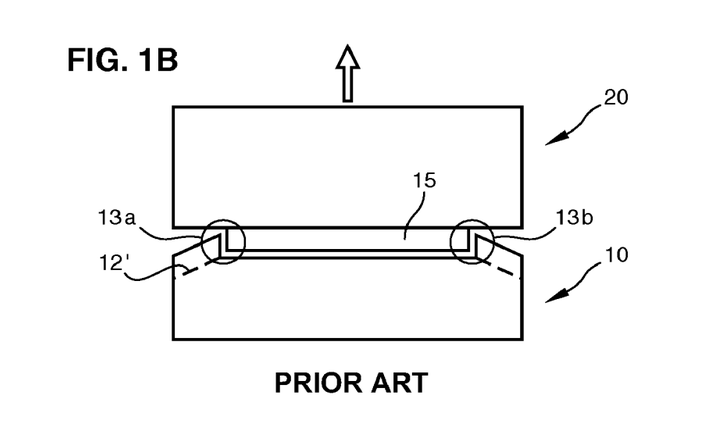

This technique is especially employed for lifting off the film, by carrying out, after the implantation, the following steps (illustrated by FIGS. 1A and 1B):

the wafer 10 is bonded on its implanted face to a receiving substrate 20; and energy (typically thermal and/or mechanical energy) is supplied so as to detach the film 15 from the implanted zone 12 (this process is known in the art by the term SMART-CUT®).

The film 15 is then taken off the wafer 10, to be transferred onto the receiving substrate 20 (see FIG. 1B).

Referring to FIGS. 1A and 1B, the faces of the wafer 10 are usually chamfered on the periphery (chamfers 11 and 11'), so that the bonding of the receiving substrate 20 to the wafer 10 takes place mainly only on the surface of the wafer 10 that is not located on the chamfer 11.

Figure 1C:
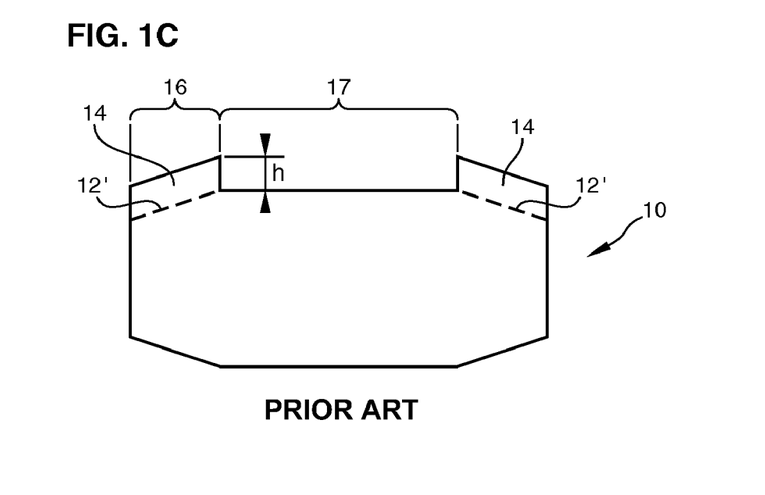

Thus, referring to FIGS. 1B and 1C, the film 15 is not exactly taken off the entire surface of the wafer 10, since, after taking-off, the chamfered portion of the film initially bounded by the implanted zone remains attached to the wafer 10, thus forming a ring 14 that surrounds a hollow volume corresponding approximately to the volume of the film 15 that is removed.

In the particular case in which the film 15 is made of crystalline material, strains can then propagate throughout the film 15 and thus have major deleterious consequences.

Furthermore, the receiving substrate 20 may itself have a peripheral chamfer, not necessarily identical to the chamfer 11 of the wafer 10, which may therefore be offset relative to the chamfer 11 so that there is irregular detachment of the film 15 along its edges. The latter effect is also accentuated by the fact that the bonding forces at the bonding interface are of course weaker along the edges than in the central portion. The film 15 taken off therefore has rather irregular edges and internal defects or damage.

DESCRIPTION OF THE PRIOR ART

Figure 2A:
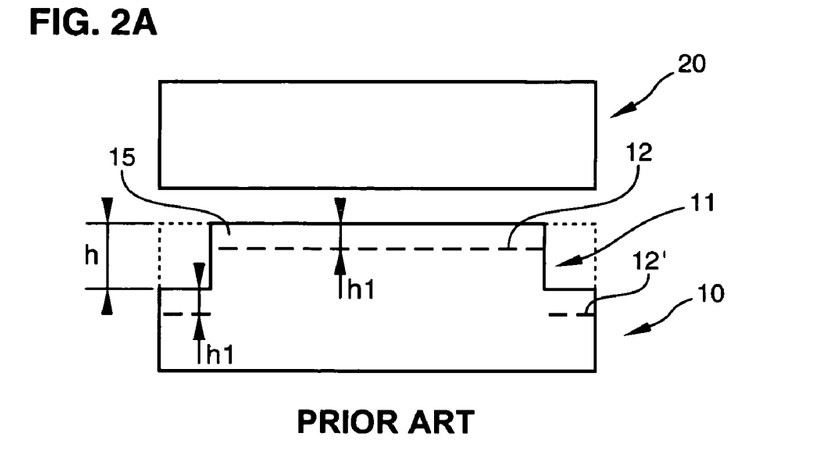
FIGS. 2A to 2C show various stages of a second known method of lifting off a film.
Figure 2B:
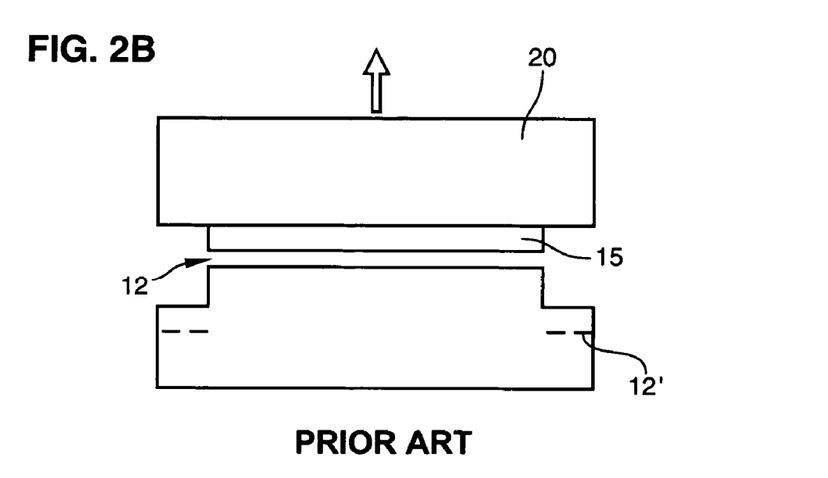
Figure 2C:
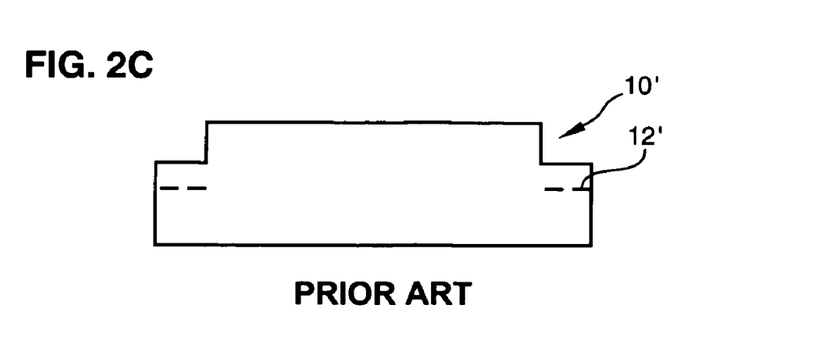

Various prior art references have discussed how to try to resolve the film removal problems. The technique proposed in document U.S. 2004/0121557 is illustrated in FIGS. 2A to 2C. It includes, prior to taking-off of the layer, routing the wafer 10 so as to remove the peripheral chamfered zones and in forming in their stead a step in the thickness of the wafer 10 with a height h. This height h may therefore be chosen to be greater than the implant depth h1 formed in the wafer 10 for the purpose of taking-off the layer. The implanted zone 12 is therefore separated from the bottom of the step 11, and therefore from the peripheral zone of the wafer 10, by a distance equal to (h-h1). The film 15 bounded by the implanted zone 12 and the implanted face therefore no longer includes chamfered peripheral zones, its free face then consisting solely of a planar surface suitable for good bonding to the receiving substrate 20.

Referring to FIG. 2B, this entire film 15 is then taken off, without having the fracture problems along the edges. The film 15 taken off is thus of better quality. The receiving substrate 20 and the film 15 may however be contaminated by the wafer 10 around its peripheral portions (i.e., on step 11). This is because the step 11 has also undergone implantation and therefore includes an implanted zone 12' that weakens the superjacent portion of the step. Furthermore, particles may become detached from this fragile portion when the implanted zone 12' is subjected to external stresses, such as those resulting from a heat treatment that is carried out in order to detach the film 15. These detached particles then contaminate the film 15 and the receiving substrate 20.

This particle contamination problem may also be manifested during the "reclaiming" treatments needed to reform a clean film, which can subsequently be transferred. This contamination may be worse if the same wafer 10 is used for several successive taking-off operations, the same step 11 then undergoing an alternation of implantations and heat treatments.

It might therefore be proposed, on the basis of U.S. Pat. No. 6,596,610, to subject the wafer 10' (as shown in FIG. 2C) after taking-off the film or layer to a thermal and/or mechanical and/or chemical reclaiming treatment in order to help in the removal of the remaining implanted zones 12, so as to be able to reuse the wafer 10'. However, the reclaiming operation proposed by U.S. Pat. No. 6,596,610 remains complex and expensive as it requires a selective treatment of the ring, and this treatment must also be repeated at each taking-off.

Thus, there is a need for improvements in these processes in order to enhance the quality and properties of the transferred layer. This need is now met by the present invention.

SUMMARY OF THE INVENTION

The invention now provides a method to remove and transfer a film from a wafer in such a way that the film is of good crystalline quality and has regular borders, with minimal contamination. It also enables reclaiming of the wafer that has provided the film, so that it can again provide additional films with minimum risk of contamination.

According to one embodiment, the invention relates to a method of producing a film for electronic, optic or optronic applications from a wafer, by forming a step of defined height around the periphery of the wafer, with the step having a mean thickness that is less than that of the wafer; and selectively implanting atomic species through a face of the wafer but not through the step to form an implanted zone at a defined implant depth with the film being defined between the face of the wafer and the implanted zone. The implantation of atomic species into the step can be prevented by forming a protective layer at least over the step or by masking the step.

The implanted zone is typically formed as a zone of weakness, so that the method further comprises bonding a receiving substrate to the implanted face of the wafer; and then supplying energy to the zone of weakness to detach the film from the wafer to transfer it to the receiving substrate. The wafer can be recycled and the steps repeated so that a plurality of films can be successively transferred.

In another embodiment, the invention proposes a method of producing a film intended for applications in electronics, optics or optronics starting from an initial wafer, which includes a step of implanting atomic species through one of the faces of the initial wafer. This method comprises the formation of a step of defined height around the periphery of the wafer, the mean thickness of the wafer at the step being less than the mean thickness of the rest of the wafer; the protection of the step against the implantation of atomic species; and the implantation of atomic species through that face of the wafer having the step, so as to form an implanted zone at a defined implant depth.

The invention also relates to a wafer for providing a film intended for applications in electronics, optics or optronics, which includes a peripheral zone having a smaller mean thickness than that of the wafer by about 1 micron or more, so as to form a step around the periphery of the wafer, wherein the step is coated with a protective layer in order to protect the step from being implanted with atomic species. The protective layer is preferably an amorphous material such as silicon oxide ($SiO_2$), silicon nitride ($Si_3N_4$), PSG (phosphosilicate glass) or BPSG (borophosphosilicate glass), while the wafer is made of bulk crystalline material or is in the form of a composite structure comprising crystalline materials. Generally, the wafer includes a support substrate, a buffer structure and an upper layer that is sufficiently thick to be facilitate transfer of a film therefrom, wherein the height of the step is equal to or greater than the thickness of the upper layer. The upper layer preferably comprises $Si_{1-x}Ge_x$, optionally in combination with one or more layers of $Si_{1-y}Ge_y$ with x differing from y and x and y being between 0 and 1, respectively.

BRIEF DESCRIPTION OF THE DRAWINGS

Other features, objects and advantages of the invention will become more clearly apparent from the description below, illustrated by the following Figures.

DETAILED DESCRIPTION OF THE PREFERRED EMBODIMENTS

The preferred method according to the invention is a film taking-off or transfer method using the well known SMART-CUT® transfer process and wafer bonding techniques.

The invention relates in particular to the preparation of the donor wafer, intended for the taking-off operation that will be carried out subsequently, implementing the following stages:

(a) the wafer is routed so as to form a step around the periphery of the wafer, the mean thickness of the wafer on the step being less than the mean thickness of the rest of the wafer;

(b) a protective layer is formed on the step so as to protect it from being implanted with atomic species; and (c) atomic species are implanted through that face of the wafer which has been routed, so as to form therein a buried zone of weakness.

Advantageously, these stages are implemented so that the height of the step is greater than the depth of implantation. Thus, the peripheral zone of the wafer will not impair the quality of the subsequent taking-off when a receiving substrate will be bonded onto the implanted face of the wafer and then the bonds in the implanted zone will be broken.

Moreover, the presence of the protective layer guarantees that the peripheral portions of the wafer are protected against the implantation of atomic species during stage (c), thus making subsequent reclaiming easier and/or improving the quality of the subsequent taking-off operation(s).

Other features of this method of producing a film are the following:

stage (a) includes the bonding of a film to a substrate in order to form the initial wafer, the film having a smaller area than the substrate so that, once these have been bonded, the step is at least partly defined by the difference in area between the film and the substrate;

stage (a) includes the removal of material from a peripheral surface of the wafer down to a defined removal depth so as to form the step;

stage (a) furthermore includes a thickening of the step;

the implant depth is equal to the height of the step or less;

according to a first embodiment of the invention, stage (b) includes the formation of a protective layer extending over at least the step and an operation to remove those portions of the protective layer which are not located on the step is optionally carried out by anisotropic etching or by polishing;

according to a second embodiment of the invention, stage (b) displays during stage (c), by masking the step during the implantation;

stage (c) is carried out in such a way that the implanted zone is a zone of weakness, in which the method furthermore includes the following stages:

a receiving substrate is bonded to the implanted face of the wafer; and then energy is supplied so as to detach the film from the wafer in the zone of weakness;

the method furthermore includes, one or more times, the following successive stages:

implantation of atomic species through the detachment surface of the previous film so as to form a zone of weakness that defines a new film below the detachment surface; and bonding of a receiving substrate to the implanted face of the wafer.

As noted, the invention also proposes a wafer for providing a film intended for applications in electronics, optics or optronics, which includes a peripheral zone having a smaller mean thickness than the rest of the wafer by about 1 micron or more, so as to form a step around the periphery of the wafer, wherein the step is coated with a protective layer in order to protect the step from being implanted with atomic species. Other features of this wafer are:

the protective layer is made of amorphous material;

the protective layer comprises $SiO_2$, $Si_3N_4$, PSG or BPSG;

according to a first embodiment, the wafer is made of bulk crystalline material;

according to another embodiment, the wafer is a composite structure of crystalline materials;

the wafer comprises a support substrate, a buffer structure and an upper layer sufficiently thick to be able to detach therefrom a film by a SMART-CUT® process, the upper layer optionally comprising $Si_{1-x}Ge_x$ and $Si_{1-y}Ge_y$, with x differing from y, x and y being between 0 and 1, respectively;

the height of the step is equal to or greater than the thickness of the upper layer.

FIGS. 3A to 3F show the various stages of a method according to the invention for lifting off a film from an initial wafer 30. This wafer 30 mainly, and advantageously, comprises one or more crystalline materials, such as semiconductor materials. The wafer 30 may be made of bulk material or is a composite structure comprising a succession of layers.

According to one embodiment, the wafer 30 includes a chamfered peripheral zone (as discussed above). Given that such a wafer 30 typically has a circular shape, this chamfered peripheral zone has an annular shape around the periphery of the wafer 30. According to this first embodiment, the wafer 30 is a fresh wafer, that is to say it has not yet undergone film transfer.

According to another embodiment, the wafer 30 includes a chamfered peripheral zone and has undergone at least one thin-film transfer operation consistent with that discussed above and illustrated by FIGS. 1A and 1B. According to this embodiment, the wafer 30 herefore includes a peripheral ring 14 that surrounds a hollow volume that is approximately identical to the volume of the previously transferred film.

According to yet another embodiment of the invention, the wafer 30 has undergone beforehand a film transfer operation and has thus already been routed according to the invention. Thus, the initial wafer 30 already includes a peripheral step.

According to a further embodiment of the invention, the wafer 30 is a hybrid substrate formed from a support substrate, onto which a film has been transferred during a prior operation. The wafer 30 can be a SOI (Silicon On Insulator) wafer for example, or else an SSOI (Strained Silicon On Insulator) or SiGeOI (SiGe On Insulator) wafer. Since in this case the wafer 30 has been produced by film transfer, a step already exists around the periphery of this wafer, corresponding to the non-transferred ring zone during the transfer operation. However, this "step" may not be sufficient, and it is necessary to carry out a routing operation on this type of substrate as well. European patent application EP 1 519 409 can be reviewed for further details regarding this type of wafer 30 and the way in which it is produced.

Figure 3A:
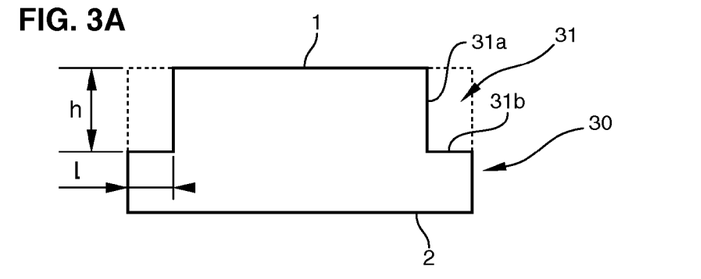
FIGS. 3A to 3F show various stages of a method of lifting off a film according to the invention.

Referring to FIG. 3A, the routing of the wafer 30 is carried out over a width l and a depth h. The routing is carried out in such a way that the step 31 thus formed has a vertical wall 31a lying essentially perpendicular to the front face 1 of the wafer 30 and a horizontal wall 31b optionally lying parallel to the front face 1 of the wafer 30, these two walls 31a and 31b intersecting each other.

The width l of the step 31 is advantageously chosen to be equal to or greater than the width of the peripheral zone of the wafer 30 in one of the above four embodiments (that is to say the chamfer according to embodiment 1, the ring according to embodiment 2 and the step according to embodiment 3 or 4). For example, the width l may be equal to a few millimeters.

Figure 3B:
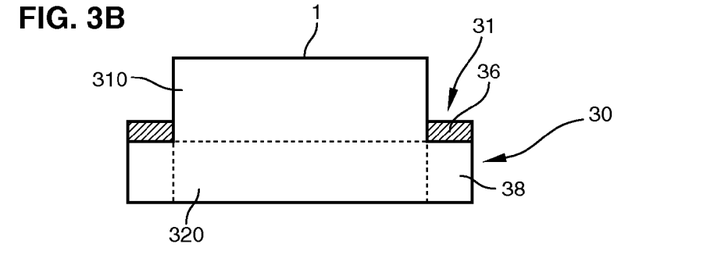
Figure 3C:
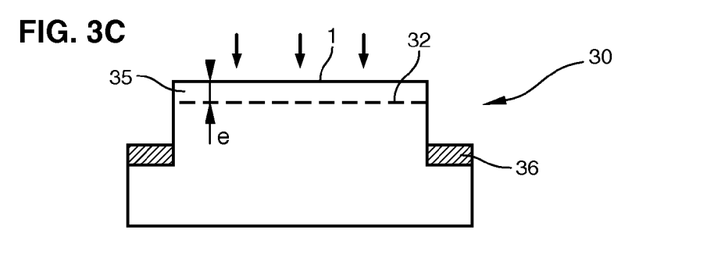

The routing is carried out in such a way that the depth of material h that is removed therefrom is greater than or equal to the depth of implantation e subsequently carried out (as illustrated in FIG. 3C). The routing depth h may thus be chosen to range between about 1000 Å and several hundred μm. The thickness of this step must be greater than the thickness removed (typically from 1000 to 2000 Å), in order typically to correspond to one or more thicknesses of film(s) to be transferred and of material removed during the reclaiming operation (a few μm), within, of course, the limits set by the thickness of the wafer (several hundred μm).

Thus, if the wafer 30 is essentially circular, the hollow volume obtained after the routing is then an annular cylinder with an outside diameter equal to the diameter of the wafer 30, an inside diameter extending right up to the vertical wall 31a and a height equal to h.

The techniques employed for this routing are substantially the same as those described in US patent application 20004/0121557, the entire content of which is expressly incorporated herein by reference thereto. These techniques may especially include mechanical machining or chemical etching of the peripheral zone of the wafer 30.

Referring to FIG. 3B, a preferred stage according to the invention includes forming a protective layer 36 on the step 31 (and in particular on the horizontal wall 31b of the step and also on the wall 31a) with a material thick enough to protect the subjacent portion 38 on the implantation subsequently carried out (as illustrated in FIG. 3C). A protective layer may also be provided on the vertical wall 31b in order to protect it from exposure to an ion beam that is not perfectly parallel to this wall 31a. Such an "inclined" implantation operation is sometimes also carried out when the crystalline material is implanted without an amorphous protective layer, so as to prevent the phenomenon of channeling.

This protective layer 36 may be produced from any type of material capable of fulfilling this function. Thus, a material in an amorphous phase may be chosen, such as $SiO_2$, $Si_3N_4$, PSG or BPSG. The thickness of the protective layer is therefore matched to the material chosen, so as to exhibit sufficient stopping power to the implanted ions.

Figure 4A:
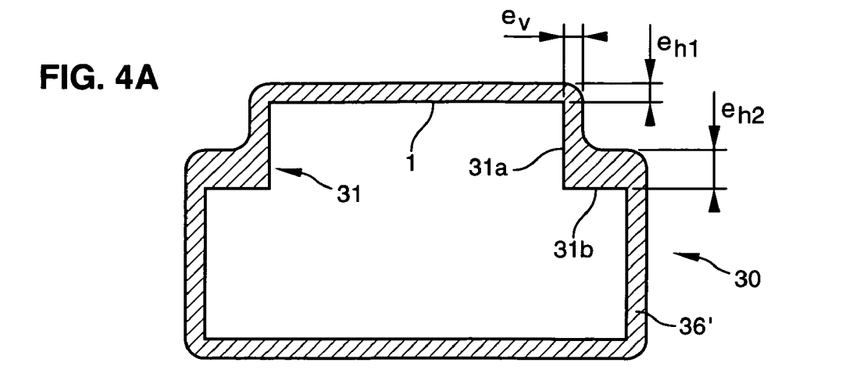
FIGS. 4A and 4B show two stages in the formation of a protective layer according to the invention.
Figure 4B:
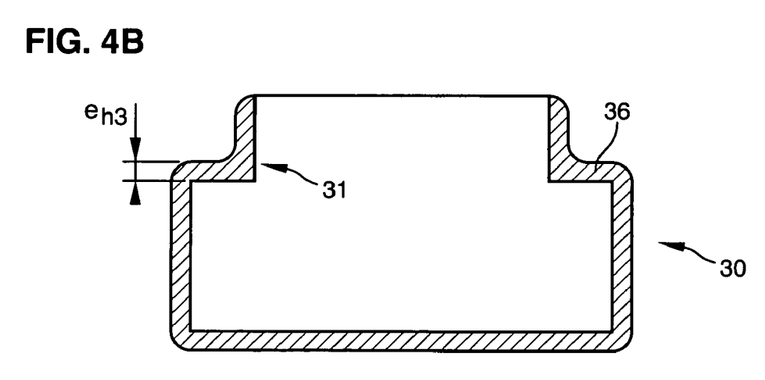

A general method for producing this protective layer is illustrated by FIGS. 4A and 4B and comprises the following stages:

formation of a layer 36' made of protective material on the wafer 30 (FIG. 4A); and optional removal of those portions of the layer 36' which are not located on the step 31, so as to keep thereon only a protective layer 36 of thickness $e_{h3}$ on the step 31 (FIG. 4B).

Referring to FIG. 4A, the first stage includes forming a layer 36' of protective material on the wafer 30, the layer 36' having a mean thickness $e_{h1}$ on the front face 1 of the wafer 30, a mean thickness $e_{h2}$ on the horizontal wall 31b of the step 31 and a mean thickness $e_v$ on the vertical wall 31a of the step 31.

These layers may be formed by material deposition and/or thermal oxidation methods.

The techniques employed for depositing the layer 36' may be of the LPCVD (Low-Pressure Chemical Vapor Deposition), PECVD (Plasma-Enhanced Chemical Vapor Deposition) or other techniques of the CVD (Chemical Vapor Deposition) type.

When the layer 36' is made of $SiO_2$, it can be deposited by $SiO_2$ deposition or it can be formed by means of tetraethoxysilane (TEOS), optionally combined with oxygen and/or ozone, applied to a surface containing silicon, or using silane and $O_2$ (also called HTO), in LPCVD or in PECVD. Optionally, dopants may be added to the $SiO_2$ layer 36', such as phosphorus, and therefore forming a PSG layer 36', or boron and phosphorus, and therefore forming a BPSG layer 36'.

When the protective layer 36' is made of $Si_3N_4$ or $Si_xN_yH_z$, it may be deposited using $SiCl_2H_2$ and $NH_3$ (in LPCVD) or $SiH_4$ and $NH_3$ (in PECVD).

Using LPCVD techniques typically results in the formation of a layer 36' having a substantially constant thickness (i.e. $e_{h1}$, $e_{h2}$ and $e_v$ are approximately equal) over the entire exposed surfaces. Thus, the layer will be formed substantially uniformly on the front face 1, the rear face 2 and on the step 31 of the wafer 30.

Using PECVD techniques typically results in the formation of a layer 36' that does not have a substantially constant thickness, the deposition mainly taking place on the faces directly exposed (the front face 1, the rear face 2 and the horizontal wall 31b of the step 31) and to a lesser extent on the sidewall (the vertical wall 31a of the step 31).

When the layer 36' is formed by thermal oxidation of the exposed surfaces of the wafer 30, these must therefore include silicon or another easily oxidizable material. Oxidation may lead to the formation of a layer 36' that has different oxidized thicknesses on the front face 1, the rear face 2 and on the sidewall, the oxidation rates being dependent on the orientation of the crystal lattice on the surfaces to be oxidized.

The layer 36' may finally include a coating of resin or polymer, or it may be completely formed therefrom.

Thus, the entire layer 36' may be formed by thermal oxidation, by material deposition or by oxidation followed by material deposition. In the last case, thin oxidation prior to deposition may in fact be envisaged for the purpose of improving the quality of the interface with the wafer 30, it then being possible to form a passivation layer, or for the purpose of limiting any contamination caused by the subsequent deposition, or for the purpose of forming a stop layer during removal by selective etching of the deposited layer.

Figure 5:
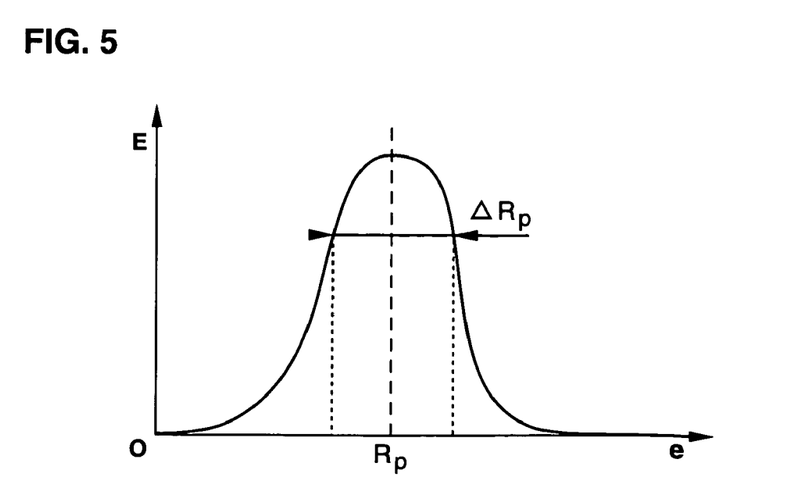
FIG. 5 is a graph showing the distribution of implantation energy over the thickness of implanted material.

In any case, to fulfill its protection role, the thickness of the protective layer 36 on the step 31, finally formed from the formation of the layer 36', must be greater than the maximum penetration of the ions into the material for the energy and dose intended. It may be considered that a protective layer 36 with a thickness of $R_p + 5\Delta R_p$ or greater ($R_p$ being the depth associated with the peak of the Gaussian distribution of the implant and $\Delta R_p$ being the standard deviation of this distribution—see FIG. 5 as illustration) is sufficient to fulfill its protection function. This is because the inventors have estimated that such a thickness is sufficient for the formation of a protective layer 36 that is sufficiently protecting.

It is possible to minimize the material to be deposited, and therefore the cost of the operation, by thus adjusting the thickness of the layer 36'.

Optionally, a removal step may be provided, for removing those portions of the layer 36' present on the front face 1, and not located on the step 31, so as to keep only a protective layer 36 of thickness $e_{h3}$ on the step 31, as illustrated in FIG. 4B.

Thus, the film that will be taken off (on the front face 1) is exposed and the step 31 is protected from the subsequent implantation.

For this purpose, and using a first technique, the front face 1 of the wafer 30 may be etched, either isotropically or anisotropically. For example, a plasma RIE (Reactive Ion Etching) anisotropic etching technique may be used, this being a preferred technique. Anisotropic etching is particularly suitable in the case in which the layer 36' is deposited uniformly with a thickness $e_{h1} > 1$ (for example by means of an LPCVD technique). Since the width l of the step is of the order of 1 mm (typically between 0.5 mm and 3 mm), it is therefore preferable for $e_{h1}$ to be substantially larger than the maximum depth of penetration of the ions into the material. The subsequent removal of a thickness typically of between $e_{h1}$ and $1.3 e_{h1}$ (a safety margin) means that the protective layer 36 on the step 31 is preserved.

The techniques employed for removing those portions of the layer 36' not located on the step 31 may also include, at least in part, selective polishing, such as polishing in which $SiO_2$ is removed more rapidly than a subjacent silicon surface, on the front face 1 and optionally on the rear face 2.

Alternatively, techniques for forming the protective layer 36 that do not require the removal of material may also be employed. Thus, for example, if the nature of the materials involved so allows, simple oxidation of the wafer 30 may allow the step 31 to be selectively oxidized without oxidizing the front face 1 (of the film to be taken off). This is the case for example when the wafer 30 includes a hybrid substrate formed from a Ge layer (which does not oxidize, or the oxide of which is not stable) on an Si substrate (which itself oxidizes), the step 31 being made of Si and the front face 1 made of Ge.

EXAMPLES

The following examples are provided to illustrate the preferred embodiments of the invention.

Example 1

Formation of the Protective Layer 36

LPCVD deposition of a thin $SiO_2$ layer;

anisotropic etching, such as RIE etching, in order to remove the protective material present on the front face 1.

Example 2

Formation of the Protective Layer 36

PECVD deposition of $SiO_2$ or $Si_3N_4$, optionally preceded by a thin thermal oxidation; a thickness of $R_p + 5*\Delta R_p$ (see above) or greater may be chosen. Thus, by adjusting the thickness of the layer 36' it is possible to minimize the amount of material to be deposited, and therefore the cost of the operation; and CMP (Chemical-Mechanical Planarization) polishing on at least the front face 1 in order to remove the $SiO_2$ or $Si_3N_4$ layer selectively over the subjacent material.

Example 3

Formation of the Protective Layer 36 thermal oxidation of the wafer 30; and

CMP polishing on at least the front face 1 in order to remove the $SiO_2$ and $Si_3N_4$ layer selectively over the subjacent material.

Example 4

Formation of the Protective Layer 36 preferential formation of at least a thin $Si_3N_4$ or $SiO_2 + Si_3N_4$ layer of between about 5 and about 50 nanometers in thickness, so as to protect the wafer 30 from the contaminants that accompany PSG or BPSG formation;

deposition of PSG or BPSG;

thermal annealing between about 850° C. and about 1100° C., so as to make the PSG or BPSG flow. The effective thickness $e_{h3}$ on the step 31 therefore increases, and then depends on thicknesses $e_{h2}$ and $e_v$, initially formed on the step, on the thickness $e_{h1}$ of the material on the front face 1, on the annealing temperature and on the concentration of P and optionally the concentration of B; and CMP polishing on at least the front face 1 in order to remove the $SiO_2$ or $Si_3N_4$ layer selectively over the subjacent material.

In all cases, the steps of forming and of removing the layer 36' are carried out in such a way that the thickness $e_{h3}$ of the remaining protective layer 36 on the step 31 is straight enough, for the material in question, to protect the subjacent peripheral zone 38 of the wafer 30 from being implanted with atomic species of the type used for preparing for a film taking-off.

Thus, for implantation energies of between 20 keV and 210 keV and an atomic species (hydrogen and/or helium) dose of between $1 \times 10^{16}$ at/cm² and $1 \times 10^{17}$ at/cm², an $SiO_2$ protective layer 36 with a thickness $e_{h3}$ of greater than about 2 microns may provide sufficient protection.

Finally, referring to FIG. 3B, the wafer 30 includes a front portion 310 having the step 31 and a rear portion 320 corresponding to the part that was not routed. The peripheral portion 38 of the rear portion 320 is defined as the part lying beyond the horizontal wall 31a of the step 31.

This peripheral portion 38 of the wafer 30 is therefore protected by the protective layer 36 from any implantation of atomic species through the front face 1 of the wafer 30. Thus, the lower portion 320 of the wafer 30 is preserved from any weakening due to the ion implantation, unlike in the conventional techniques.

Referring to FIG. 3C, an atom implantation step is carried out through the front face 1 of the wafer 30 so as to create an implanted zone 32 at a depth e, advantageously defined as being less than or equal to the height h of the step 31.

The atomic species employed may be helium and/or hydrogen and/or other types of ionized atomic species, having a dose of between $1 \times 10^{16}$ at/cm² and about $1 \times 10^{17}$ at/cm². The implantation energy is typically between 20 keV and 210 keV.

Optionally, an operation to remove (preferably selectively) the protective layer 36 is carried out. It is preferable to remove this by etching, as a mechanical removal operation could lead to particulate contamination prejudicial to the quality of the bonding and of the structure to be formed. For example, HF may be used for selectively etching an $SiO_2$ protective layer 36.

The film 35 to be taken off is then bounded by the implanted zone 32 and by the front face 1 of the wafer 30.

The implanted zone 32 thus constitutes a zone of weakness within which the bonds between the film 35 and the subjacent portion of the wafer 30 are weaker than elsewhere.

Figure 3D:
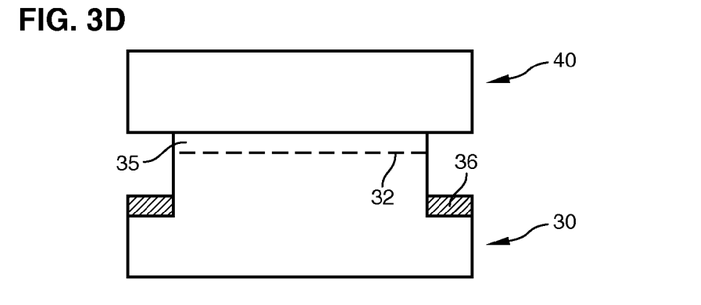

FIG. 3D shows a stage in which a receiving substrate 40 is bonded to the wafer 30 on its front face 1.

It is advantageous to prepare one or both surfaces to be bonded prior to the bonding operation so as to make these surfaces more hydrophilic and of better quality for the bonding. For example, it will be possible to carry out RCA cleaning, or plasma activation, or chemical cleaning based on hydrochloric acid, chemical-mechanical planarization, polishing, etc.

Optionally, and before the implantation, a bonding layer is formed on one or both surfaces to be bonded so as to improve the quality of the bonding. Optionally, this bonding layer or these bonding layers are made of insulating material so that the film 35 once taken off is electrically isolated from the receiving substrate 40. A $SiO_2$ or $Si_3N_4$ bonding layer may thus be used.

As a variant, the bonding layer on the wafer 30 may have been formed during the protective layer 36, by leaving at least one portion of the protective material 36' deposited on the front face 1 of the wafer 30 (see FIG. 4A).

A heat treatment suitable for increasing the bond strength may optionally be carried out after the bonding, for example at a temperature of between about 200° C. and about 350° C. for a few hours.

The receiving substrate 40, in a first embodiment, has a bonding surface whose area is greater than that of the front face 1 of the wafer 30. The film 35 to be taken off then has an area less than the receiving substrate 40 onto which it will be transferred.

In another embodiment, the receiving substrate 40 has a bonding surface whose area is substantially identical to that of the front face 1 of the wafer 30 so that the combination of the receiving substrate 40 and the film 35 to be taken off has no visible peripheral step. For this purpose, it is possible in particular to carry out a suitable routing operation on the receiving substrate 40 prior to bonding, or to choose a starting wafer 30 that is slightly larger than the receiving substrate 40 and to carry out the suitable routing in such a way that in the end the front face 1 has an area substantially identical to that of the receiving substrate 40. This second embodiment may be preferred, as it makes it possible to eliminate or minimize any exclusion zone (non-transferred zone) on the final product relative to the free space caused by the routing, which exclusion zone would be generated if the wafer 30 after routing had had a different size from that of the receiving substrate 40.

Figure 3E:
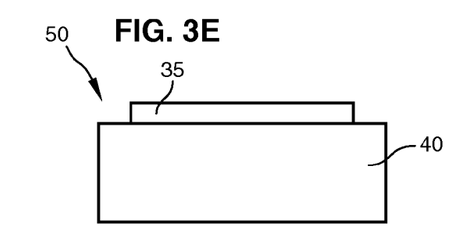

A supply of energy, such as thermal and/or mechanical energy, then allows the bonds in the implanted zone 32 to be broken and thus enables the film 35 to be transferred from the wafer 30 onto the receiving substrate 40, and therefore to produce the structure 50 shown in FIG. 3E.

If the lifted-off film 35 is made of semiconductor material and if a bonding layer made of insulating material was provided between the wafer 30 and the receiving substrate 40, the structure 50 obtained is then a semiconductor-on-insulator structure.

An optional finishing stage may then be provided, in order to eliminate any roughness from the detached surface of the film 35 and to make this surface one of high quality.

Figure 3F:
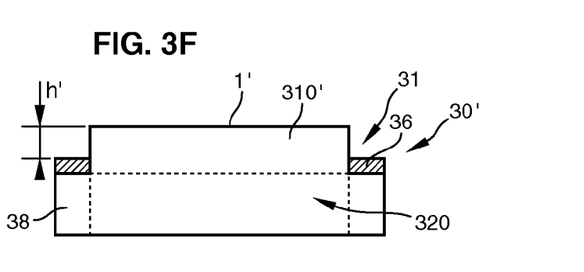

Referring to FIG. 3F, the wafer 30' after taking-off comprises a front portion 310' amputated from the film 35 and a rear portion 320 entirely preserved thanks to the presence of the protective layer 36 on the step 31.

The protective layer 36 may possibly then be removed, if this has not already been done, for example by etching, and optionally by selective etching.

This wafer 30' may then be optionally reclaimed, so as to be used once again as donor wafer for a new film taking-off.

For this purpose, the front face 1' is advantageously treated so as to become a bonding surface of sufficient quality to ensure good bonding to another receiving substrate.

If this treatment involves the use of chemical species, the protective layer 36 may serve to protect the rear portion 320 of the wafer 30, and in particular the step 31 (vertical wall 31a and horizontal wall 31b), from any chemical attack. The material of the protective layer 36 may thus be chosen for this purpose. Care should therefore be taken to produce the protective layer 36, if this has not already been done, before the etching.

The front portion 310' of the wafer 30 can then be thickened by means of an epitaxial growth on its front face 1' treated so as to receive the newly implanted atomic species for the purpose of a subsequent film transfer. This epitaxial growth may optionally be preceded by a polishing or etching step. It is therefore preferable to have chosen a protective layer 36 made of an amorphous material so that the epitaxy takes place only on the front face 1' of the wafer 30', and not also on the step 31. Thus, in this case, the protective layer 36 also fulfills the function of protecting the step 31 from any deposition.

n a first embodiment, the implantation for preparing the next taking-off is carried out directly after the treatment of the front face 1' if a protective layer 36 has already been formed, or, if this is not so, directly after the formation of the protective layer 36.

In a first particular case, the new implantation is located at a depth greater than the height h' of the step 31. Thus, after taking-off, a ring in accordance with what is known from the prior art (see in particular FIG. 1C) is again obtained, with the exception that the rear portion 320 of the wafer 30 in this case remained intact.

In another particular case, the implant depth is less than the height h' of the step 31 and the taking-off is then substantially in accordance with the taking-off according to the invention with reference to FIGS. 3B to 3F. In this particular case, provision will thus be made to route down to a depth such that there is a means of lifting off two films from the front part 310 of the wafer 30, without encroaching on the rear portion 320 of the wafer 30.

In a second embodiment, a further routing operation is carried out so as to increase the height h' of the step so that the next atom implantation takes place at a depth of less than or equal to the next height of the step 31. The method of preparing the wafer 30 for take off described above with reference to FIGS. 3A to 3F then applies in the rest of the process for this last film transfer.

Figure 6:
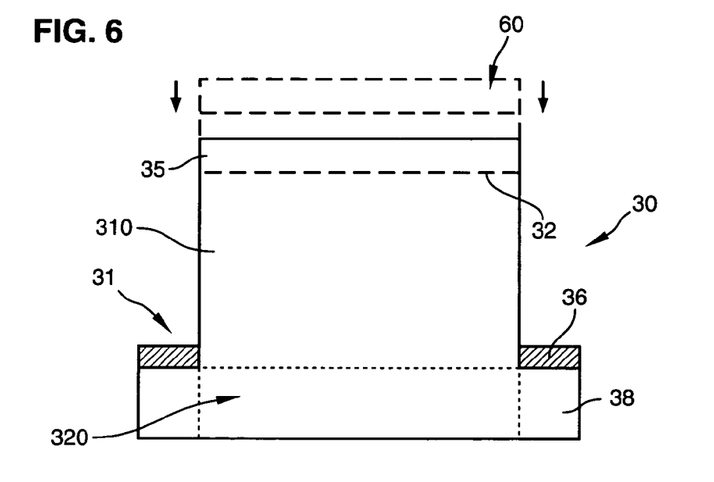
FIG. 6 shows a first wafer that can undergo several successive film taking-off operations according to the invention.
Figure 7:
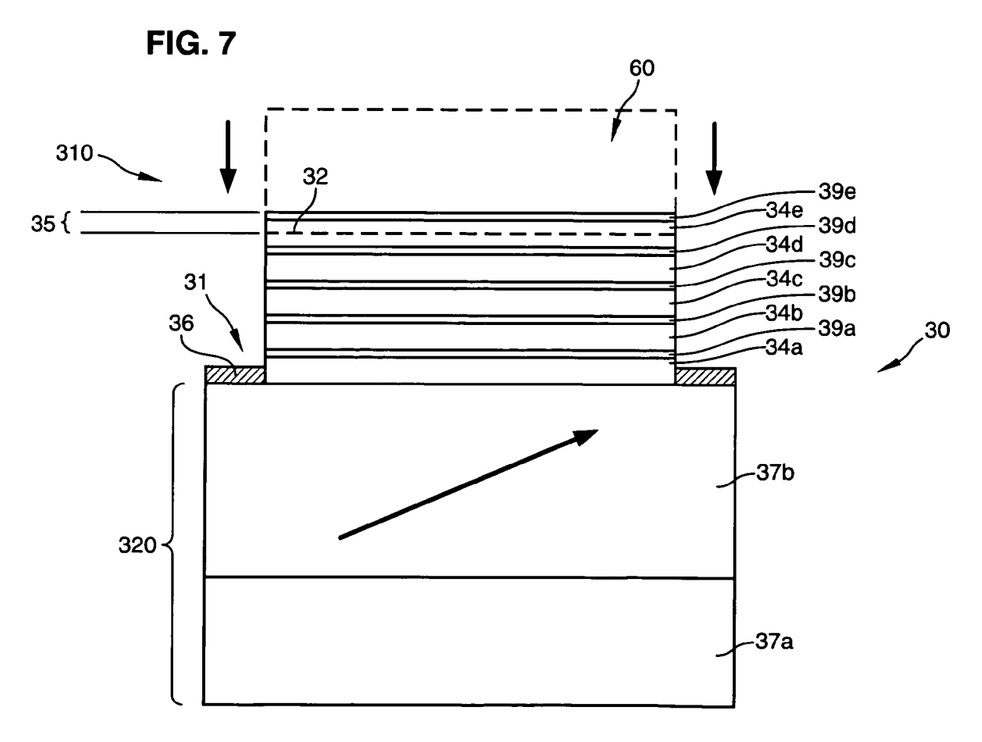
FIG. 7 shows another first wafer that can undergo several successive film taking-off operations according to the invention, with each of the wafers of FIGS. 6 and 7 having a peripheral step protected according to the invention.

FIGS. 6 and 7 show particular cases of films being successively taken off from the same wafer 30, which has a peripheral step 31 protected according to the invention.

Referring to FIG. 6, the height of the step 31 in this wafer 30 is such that the front portion 310 of the wafer 30 is sufficiently thick to successively take off one or more films therefrom, without having to route between each taking-off.

In a first embodiment of this step 31, a routing operation is carried out according to what was mentioned above, down to a suitable depth and over a suitable width.

The detachment face of the wafer 30 is simply reclaimed between each taking-off.

This structure is particularly efficient, as it offers the possibility of several successive films being rapidly and simply taken off, while still preserving the donor wafer 30.

Furthermore, the protective layer 6 guarantees protection of the rear portion 320 of the wafer 30, and in particular protects the subjacent portion 38 from successive atom implantations to which it would be subjected otherwise. Thus, if this protective layer 36 were not present, the subjacent portion 38 would become increasingly fragile as films are progressively taken off, to the point where particles would be detached and contaminate the front portion 310, the lifted-off film 50 and the receiving substrate 40.

Thus, for example the rear portion 320 of the wafer 30 may be a silicon support substrate followed by a buffer structure made of SiGe having a germanium concentration that progressively increases over the thickness until reaching a concentration x (of between 0 and 1) on a defined surface. The front portion 310 may in this case for example be made of an epitaxially grown $Si_{1-x}Ge_x$ material, the concentration x of which is substantially identical to that of the material constituting the surface of the subjacent buffer layer.

In a second embodiment of the step 31 of FIG. 6, the front portion 310 has been bonded to the rear portion 320, this front portion 310 having a smaller area than the rear portion 320 so that, after bonding, the step 31 appears without it being absolutely necessary to carry out an additional routing operation. The height of this pre-existing step 31 is then about half the height of the transferred film (1700 Å for example, with about 200 Å of crystalline layer and about 1500 Å of bonding layer). The front portion 310 may thus be taken off an initial donor wafer using a film transfer technique, for example a SMART-CUT® process.

Again in this embodiment of the step 31, the bonding stage may include the formation of a bonding layer made of insulating material on one or both of the surfaces to be bonded. The wafer 30 produced is then of the semiconductor-on-insulator type, such as a wafer 30 of the SiGeOl type (for example by bonding a front portion 310 made of relaxed SiGe), referring for example to the technique described in FR 02/08600 incorporated here for reference. In particular, this wafer 30 may be produced by oxide/oxide bonding, that is to say an oxide bonding layer, for example about 1500 Å in thickness, will have been formed on the front portion 310 (the relaxed SiGe layer) and an oxide bonding layer, for example about 1500 Å in thickness, will have been formed on the rear portion 320 (for example made of bulk Si).

The bonding layer formed on the rear portion 320 may also act as a protective layer 36 on the horizontal face 31a of the step 31.

After optional heat treatments, with a view to improving the crystalline quality of the transferred film, this front portion 310 may be thickened up to about 2 microns. After this deposition, a wafer 30 as shown in FIG. 6 is therefore obtained (without having carried out a specific routing operation).

Optionally, routing may then be carried out, over a lateral distance (for example of between about 1 mm and about 3 mm) so as to produce a sharp contour on the step 31. A protective layer 36 according to the invention is then formed.

FIG. 7 illustrates a wafer 30 that has been routed over a height such that the front portion 310 can provide several films by taking-off according to the invention, without it being necessary to route it between each taking-off.

The front portion 310 is a composite structure comprising alternately layers of a first material (34a, 34b, 34c, 34d, 34e) and layers of a second material 39a, 39b, 39c, 39d, 39e), these being initially formed by epitaxy starting from the rear portion 320 of the wafer and before routing. Thus, it will be possible to have a front portion 310 comprising a succession of SiGe layers (34a, 34b, 34c, 34d, 34e) and a succession of elastically strained material $Si_{1-y}Ge_y$ layers (39a, 39b, 39c, 39d, 39e), where x differs from y, and x and y are between 0 and 1 respectively, these layers being grown epitaxially from the rear portion 320, including an SiGe buffer layer 37b and a bulk Si support substrate 37a.

One of the successive implantations for preparing for successive taking-offs may therefore be carried out within an $Si_{1-x}Ge_x$ layer (34e) so as to therefore prepare the transfer, with the subjacent strained $Si_{1-y}Ge_y$ layer (39e), onto the receiving substrate 40.

It will therefore be possible to treat the structure comprising the receiving substrate and these lifted-off films so as to preserve only a portion of the $Si_{1-x}Ge_x$ layer, so as to obtain a strained $Si_{1-x}Ge_x/Si_{1-y}Ge_y$-on-insulator structure.

As an alternative, the entire $Si_{1-x}Ge_x$ remainder is removed so as in the end to obtain a strained $Si_{1-y}Ge_y$-on-insulator structure. For this purpose, selective etching between these two materials may be carried out.

As regards the remaining wafer 30, the taking-off surface may be reclaimed so as to preserve at least a portion of the layer 34e into which the atomic species were implanted, by means of a polishing or chemical etching operation.

As an alternative, the entire remainder of the layer 34e is removed by carrying out selective etching between $Si_{1-x}GE_x$ and the subjacent $Si_{1-y}Ge_y$ (layer 39d).

It should be noted that the protective layer 36 may also protect the rear portion 320 of the plate 30, and in particular the step 31 (vertical wall 31a and horizontal wall 31b), from such chemical attack. A material suitable for producing such a stop layer may in particular be chosen.

In one particular case according to the proposed method illustrated in FIG. 7, y is chosen to be equal to 0 so that the strained $Si_{1-y}Ge_y$ layers (layers 39a, 39b, 39c, 39d, 39e) are made of elastically strained Si.

More generally, the invention is not limited to just the examples mentioned above—in particular, the wafer 30 is not necessarily protected by a protective layer 36 formed on the step 31—but extends to any type of protection capable of protecting the step 31 from implantation.

Thus, in a first alternative method of protection, a mask may be provided on the step 31 during implantation. This mask may thus be designed so as to permit only the passage of ions intended to form the zone of weakness 32 beneath the front face 1 of the wafer 30 and to prevent ions from reaching the step 31. This mask may be located level with the implanter or level with the wafer 30, or at an intermediate level.

In a second alternative method of protecting the step 31, and within the context in which an implantation system allowing an ion beam to scan one or more wafers 30 along a predetermined path is used, this predetermined path is defined so that the ions reach only the front face 1 of each wafer 30 and do not reach the step 31. Suitable means for controlling the ion beam and/or the moving support for the wafer(s) 30 may thus predefine the path of the ions on each wafer 30. Thus, the scanning may be automatically controlled, for example by predetermining the path using an automation computer program.

Of course, a person skilled in the art will thus understand that this invention is not limited to the case of SiGe and strained Si, but may be applied to any crystalline or non-crystalline material, in which a taking-off or an atom implantation according to the invention may be carried out. In particular, crystalline materials may be chosen that belong to the family of II.VI or III.V alloys and/or doped materials and/or materials that include carbon with a concentration ranging from about 5% to about 50%.

What is claimed is:

1. A method of producing a film for electronic, optic or optronic applications from a wafer, which comprises:
    first forming a step of defined height around the periphery of the wafer, with the step having a mean thickness that is less than that of the wafer;
    forming a protective layer over at least the step to prevent atomic species from being implanted into the step; and
    thereafter selectively implanting atomic species through a face of the wafer but not through the step to form an implanted zone at a defined implant depth with the film being defined between the face of the wafer and the implanted zone.

2. The method of claim 1, which further comprises forming the wafer by bonding a film to a substrate, with the film having a smaller area than that of the substrate so that, after bonding, the step is at least partly defined by the difference in area between the substrate and the film.

3. The method of claim 1, wherein the step is formed by removing material from a peripheral surface of the wafer down to a defined removal depth.

4. The method of claim 1, further comprising thickening of the step.

5. The method of claim 1, wherein the atomic species implantation depth is equal to or less than the height of the step.

6. The method of claim 1, wherein the wafer is one that has previously been subjected to a film removal operation, the wafer therefore having a ring on a peripheral zone of a face, and which further comprises removing the ring prior to forming the step.

7. The method of claim 1, wherein the height of the step is about 1 micron or more.

8. The method of claim 1, which further comprises also forming the protective layer on portions of the wafer that are not located on the step.

9. The method of claim 8, which further comprises removing those portions of the protective layer which are not located on the step by anisotropic etching or polishing.

10. The method of claim 1, wherein the protective layer is provided with a thickness which on average is substantially equal to or greater than the sum of the implantation depth of the atomic species that is associated with the peak of the Gaussian distribution of the implanting, and a depth corresponding to about five times the standard deviation of this distribution.

11. The method of claim 1, which further comprises removing the protective layer after implanting the atomic species into the wafer.

12. The method of claim 1, wherein the protective layer is made of an amorphous material comprising silicon oxide, silicon nitride, phosphosilicate glass or borophosphosilicate glass.

13. The method of claim 1, wherein the implanted zone is formed as a zone of weakness, and the method further comprises:
    bonding a receiving substrate to the implanted face of the wafer; and then
    supplying energy to the zone of weakness to detach the film from the wafer to transfer it to the receiving substrate.

14. The method of claim 13, which further comprises forming a bonding surface on the wafer and removing material from the periphery of the receiving substrate to provide a bonding surface that is substantially identical to that of the wafer.

15. The method of claim 13, wherein, after detaching the film from the wafer, the method further comprises selectively implanting atomic species through a face of the wafer but not through the step to form an implanted zone at a defined implant depth with the film being defined between the face of the wafer and the implanted zone.

16. The method of claim 13, after detaching the film from the wafer, the method further comprises, one or more times, the following successive steps:
    selectively implanting atomic species through a face of the wafer but not through the step to form an implanted zone at a defined implant depth with the film being defined between the face of the wafer and the implanted zone;
    bonding a receiving substrate to the implanted face of the wafer; and then
    supplying energy to the zone of weakness to detach the film from the wafer to transfer it to the receiving substrate.

17. The method of claim 13, which further comprises conducting a cleaning or chemical etching operation after transferring the film, the operation conducted in such a way that wafer surface that remains after the transfer is provided at a quality sufficient to carry out a subsequent bonding operation to a receiving substrate for transfer of a further film from the wafer.

18. The method of claim 1, wherein the wafer comprises an $Si_{1-x}Ge_x$ layer on a substrate, x being between 0 and 1, and having a thickness sufficient to allow a plurality of films to be sequentially transferred from this $Si_{1-x}Ge_x$ layer.

19. The method of claim 1, wherein the wafer comprises a $Si_{1-x}Ge_x$ layer and an elastically strained $Si_{1-y}Ge_y$ layer on a substrate, with x and y being between 0 and 1 and y being substantially different from x, and wherein the atomic species are implanted in the $Si_{1-x}Ge_x$ layer.

20. The method of claim 1, wherein the wafer comprises a composite structure on a support substrate, the composite structure comprising alternate $Si_{1-x}Ge_x$ layers and elastically strained $Si_{1-y}Ge_y$ layers, with x and y being between 0 and 1 and y being substantially different from x, and the atomic species are subsequently implanted in an $Si_{1-x}Ge_x$ layer.

21. The method of claim 20, which further comprises removing any remaining portions of the $Si_{1-x}Ge_x$ layer after transfer of a film to prepare the wafer for subsequent operations.

22. A method of producing a film for electronic, optic or optronic applications from a wafer, which comprises:

first forming a step of defined height around the periphery of the wafer, with the step having a mean thickness that is less than that of the wafer;

masking the step during the implanting to prevent atomic species from being implanted into the step; and thereafter selectively implanting atomic species through a face of the wafer but not through the step to form an implanted zone at a defined implant depth with the film being defined between the face of the wafer and the implanted zone.

23. A method of producing a film for electronic, optic or optronic applications from a wafer, which comprises:

first forming a step of defined height around the periphery of the wafer, with the step having a mean thickness that is less than that of the wafer;

forming a protective layer on the step to prevent atomic species from being implanted into the step;

thereafter selectively implanting atomic species through a face of the wafer but not through the step to form an implanted zone at a defined implant depth with the film being defined between the face of the wafer and the implanted zone;

transferring the film to another substrate; and conducting a cleaning or chemical etching operation after transferring the film;

wherein the protective layer is also capable of protecting the step from the chemical agents used during the cleaning or chemical etching operation.

24. The method of claim 23, wherein, after the protective layer has been formed, the method further comprises growing an epitaxial layer prior to a subsequent implanting of atomic species.

* * * * *